(12) United States Patent
Tanaka et al.

(10) Patent No.: US 6,536,032 B1
(45) Date of Patent: Mar. 18, 2003

(54) METHOD OF PROCESSING EXPOSURE MASK-PATTERN DATA, SIMULATION USING THIS METHOD, AND RECORDING MEDIUM

(75) Inventors: Satoshi Tanaka, Kawasaki (JP); Soichi Inoue, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/510,245

(22) Filed: Feb. 22, 2000

(30) Foreign Application Priority Data

Feb. 22, 1999 (JP) .......................................... 11-042733

(51) Int. Cl.$^7$ ............................................... G06F 17/50
(52) U.S. Cl. ......................................... 716/21; 716/19
(58) Field of Search ........................... 716/19, 20, 21

(56) References Cited

U.S. PATENT DOCUMENTS

| | | | | |
|---|---|---|---|---|
| 5,657,235 A | * | 8/1997 | Liebmann et al. | 250/492.22 |
| 5,707,765 A | * | 1/1998 | Chen | 430/296 |
| 5,815,685 A | * | 9/1998 | Kamon | 716/21 |
| 6,042,257 A | * | 3/2000 | Tsudaka | 700/121 |
| 6,081,658 A | * | 6/2000 | Rieger et al. | 250/492.22 |
| 6,114,071 A | * | 9/2000 | Chen et al. | 430/5 |
| 6,214,494 B1 | * | 4/2001 | Bula et al. | 430/30 |

FOREIGN PATENT DOCUMENTS

JP 09-034101 2/1997

OTHER PUBLICATIONS

Pierrat, C. et al., "Phase shifting mask topography effects on litographic image quality", Dec. 1992. IEEE, pp. 53–56.*

* cited by examiner

Primary Examiner—John F. Niebling
Assistant Examiner—Stacy Whitmore
(74) Attorney, Agent, or Firm—Finnegan, Henderson, Farabow, Garrett & Dunner, L.L.P.

(57) ABSTRACT

Disclosed herein is a method of processing exposure mask-pattern data. The method comprises the steps of performing a re-sizing process of adding a prescribed positive bias Δ to design data of an exposure mask pattern, thereby forming first mask-pattern data, performing a corner process on each corner represented by the first mask-pattern data, thereby forming second mask-pattern data, and performing a re-sizing process of adding a prescribed negative bias Δ' to the second mask-pattern data, thereby forming third mask-pattern data.

15 Claims, 5 Drawing Sheets

——— : ORIGINAL MASK
- - - - : UNIFORM CORNER PROCESS
—·—·— : CORNER PROCESS OF THIS INVENTION

METHOD OF PROCESSING EXPOSURE MASK-PATTERN DATA, SIMULATION USING THIS METHOD, AND RECORDING MEDIUM

CROSS-REFERENCE TO RELATED APPLICATION

This application is based upon and claims the benefit of priority from the prior Japanese Patent Application No. 11-042733, filed Feb. 22, 1999, the entire contents of which are incorporated herein by reference.

BACKGROUND OF THE INVENTION

The present invention relates to a method of simulating an optical image, using an exposure mask. Particularly, the invention relates to a method of increasing the accuracy of predicting the simulated shapes of the corners of a mask pattern.

Patterns to be transferred to a semiconductor wafer to manufacture LSIs have become more microminiature. To transfer microminiature patterns to a semiconductor wafer, various techniques are now employed. Among these are: using, in the exposure apparatus, a light source that emit light of a short wavelength; utilizing a projection optical system that has an increased numerical aperture; using high-resolution resists; applying super resolution techniques (using modified illumination) phase-shifted masks.

Thanks to these techniques, it has become possible to transfer patterns having small $k_1$ values. (A $k_1$ value is a pattern size normalized with λ/NA, where is the wavelength of the light applied in the exposure apparatus and NA is the numerical aperture of projection optical system.) When a low-$k_1$ pattern is transferred to a wafer, its shape deviates from the desired shape due to optical proximity effect.

In order to correct the shape of the pattern from deviating from the desired one, a resist pattern based on the design pattern is simulated. The design pattern is modified in accordance with the results of simulation, so that the pattern transferred to the wafer may be identical in shape to the desired pattern.

Most methods of simulating a resist pattern obtained from the design pattern of an exposure mask, which is shaped like the design, are to perform various calculations based on Fourier imaging theory. In recent years, patterns have become more microminiature, and the transfer magnification has been changed from 1/5 to 1/4, the elements of the pattern on the mask now have a width of less than 1 μm. The pattern formed on the exposure mask conspicuously deviates in shape from the desired pattern.

The pattern on the exposure mask deviates in shape from the desired pattern, particularly at its corners. More precisely, the corners are rounded though they should be angled, causing so-called "corner rounding." If light is applied to a resist through the exposure mask having this undesired pattern, a significant difference in shape will occur between the resultant resist pattern and a resist pattern simulated directly based on the design pattern.

Two main factors determine the degree of corner rounding in the exposure mask pattern. The first factor is the resolution of the mask-drawing apparatus used. The second factor is the etching process performed.

The resolution of the mask-drawing apparatus depends on the diameter of the mask-drawing beam applied. It is generally expected that the resolution of the mask-drawing apparatus will not cause an outside corner and an inside corner of a mask pattern element to have different shapes. Hence, the first factor of determining the degree of corner rounding can hardly be said to result in a difference between the outside and inside corners the mask pattern element in terms of rounding.

In many cases, however, a mask pattern is etched a little more than the resist pattern size for enhancing the uniformity in planar mask size. Consequently, an outside corner and an inside corner of a mask pattern element will have difference shapes due to the second factor determining the degree of corner rounding.

Figure 9:
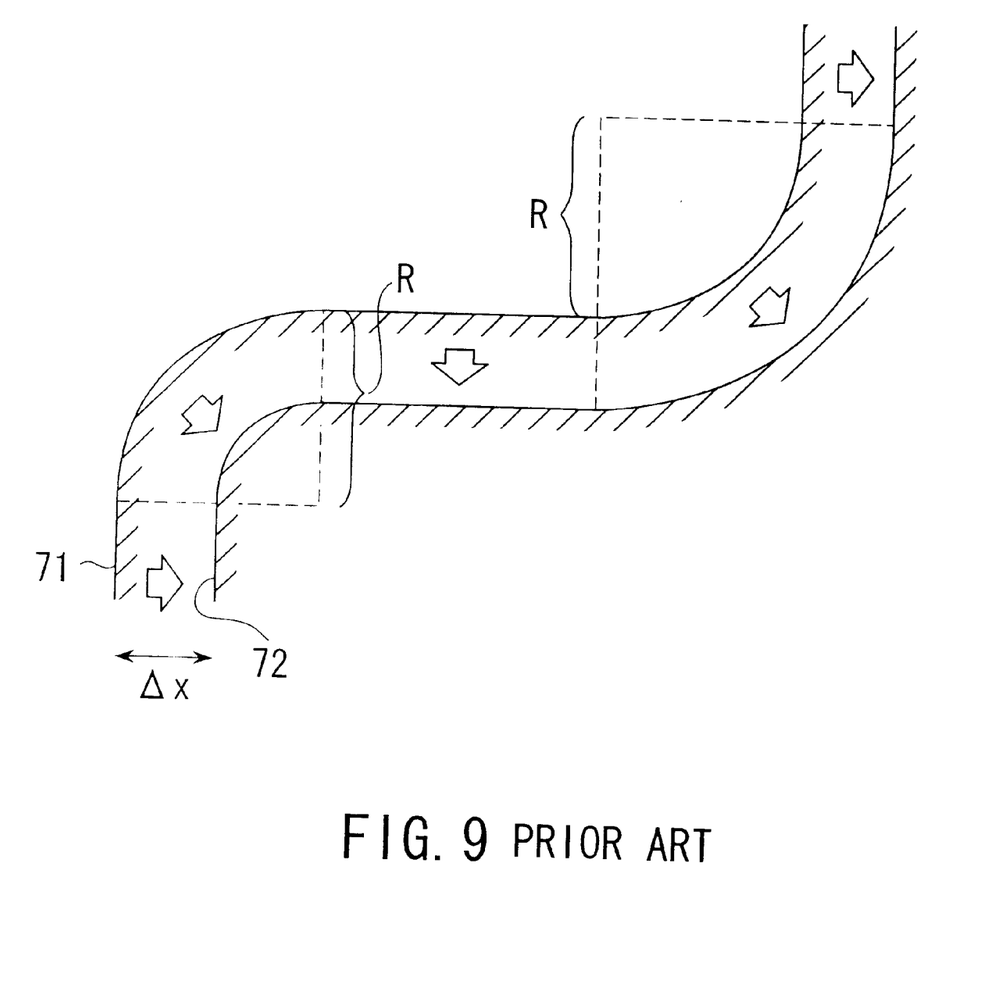
FIG. 9 is a diagram explaining how an outside corner and inside corner of a mask pattern element are rounded to different degrees.

With reference to FIG. 9, it will be described how the outside corner and inside corner of a mask pattern element are rounded to different degrees. Assume that a resist pattern 71 has been formed by a mask-drawing process. The hatching indicates the area on which the resist remains. After the resist pattern 71 is developed, its corners are rounded, each having the same radius (R) of curvature. This pattern 71 may be used as an etching mask to process a mask shield (made of Cr or the like). In this case, the pattern 71 is etched a little more than necessary, by an over-etching distance of Δx.

Assume that the etching proceeds along a normal to the surface being etched. Then, it is expected that the resist pattern will have a shape 72. Any outside corner of the pattern will have a smaller radius of curvature, R−Δx, whereas the any inside corner will have a larger radius of curvature, R+Δx. Obviously, the outside and inside corners of the resist pattern have been rounded to different degrees.

BRIEF SUMMARY OF THE INVENTION

The object of the present invention is to provide a method of processing exposure-mask pattern data, thereby to render a pattern used in simulation similar to a pattern actually used, in order to increase the precision of simulation. Another object of the invention is to provide a method of performing simulation. Still another object of the invention is to provide a recording medium.

According to the present invention, there is provided a method of processing exposure mask-pattern data. The method comprises the steps of: performing a re-sizing process of adding a prescribed positive bias Δ to design data of an exposure mask pattern (which is defined as opaque are on the mask), thereby forming first mask-pattern data; performing a corner process on each corner represented by the first mask-pattern data, thereby forming second mask-pattern data; and performing a re-sizing process of adding a prescribed negative bias Δ' to the second mask-pattern data, thereby forming third mask-pattern data.

According to the invention, there is provided a method of simulating an optical image by applying light through an exposure mask pattern. This method comprises the steps of: performing a re-sizing process of adding a prescribed positive bias Δ to design data of the exposure mask pattern, thereby forming first mask-pattern data; performing a corner process on each corner represented by the first mask-pattern data, thereby forming second mask-pattern data; performing a re-sizing process of adding a prescribed negative bias Δ' to the second mask-pattern data, thereby forming third mask-pattern data; setting exposure conditions; and calculating a optical image in accordance with the third mask pattern data and the exposure conditions, on a substrate to which light is applied through the exposure mask pattern.

According to the present invention, there is provided a recording medium, which stores a program for causing a computer to process the exposure mask-pattern data.

In the method of processing exposure-mask pattern data, the method of simulating an optical image, and the recording medium, all described above, it is desired that:

(a) The sum of the positive bias Δ and negative bias Δ' should be a mask bias for the design data of the exposure mask pattern, and the positive bias Δ corresponds to a bias for a mask-drawing resist pattern.

(b) The corner process should be to round each corner represented by the first mask-pattern data, thereby forming an arc which has a radius R and which inscribes the corner.

(c) The corner process should be to replace, at each corner represented by the first mask-pattern data, an arc having a radius R and inscribing the corner, by a plurality of continuous lines.

(d) A change in area of a pattern, which takes place after the arc has been replaced by a plurality of continuous lines, should be equal to a change in area of the pattern, which occurs when the corner is changed to an arc having a radius R and inscribing the corner.

Thanks to the characterizing features described above, the present invention is advantageous in the following respects.

The mask formed by the method according to the invention has a shape similar to the shape of the mask pattern that is formed in practice. Hence, when the exposure mask-pattern data is processed by the method described above, it is possible to calculate a high-precision optical image. In addition, the load on data processing does not increase so much as in the method wherein a uniform corner process is performed on mask pattern data.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An embodiment of the present invention will be described, with reference to the accompanying drawings.

Figure 1:
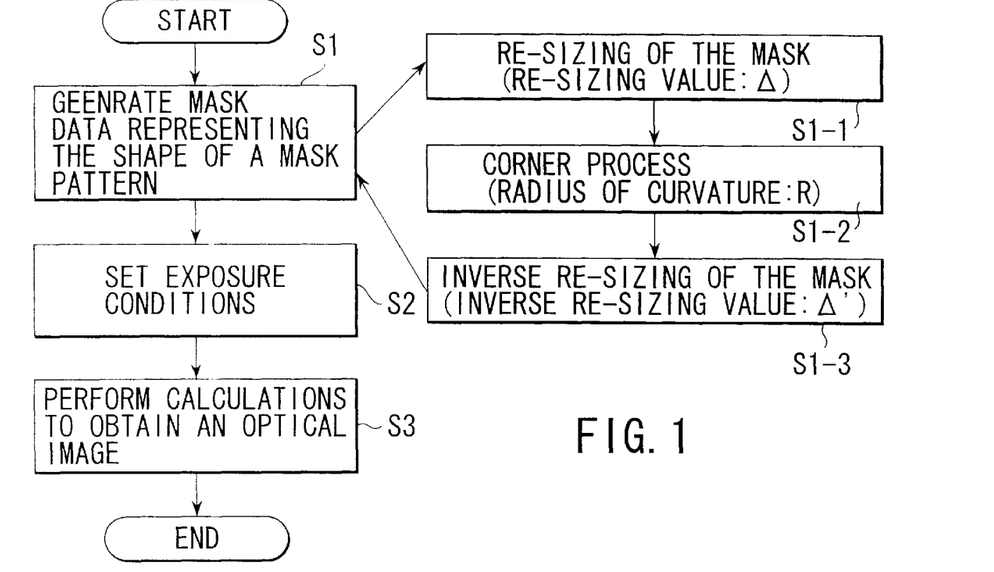
FIG. 1 is a flow chart explaining the process of forming an mask pattern for use in simulation, according to an embodiment of the present invention.

The embodiment of the invention will be first summarized, with reference to FIG. 1 and FIGS. 2A to 2D. FIG. 1 is a flow chart explaining the process of forming a mask pattern for use in simulation, according to the present invention. FIGS. 2A to 2D are diagrams illustrating the process of forming the mask pattern, according to the invention.

Figure 2A:
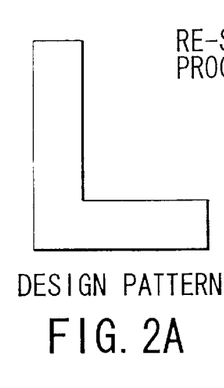
FIGS. 2A to 2D are diagrams illustrating the process of forming the mask pattern.
Figure 2B:
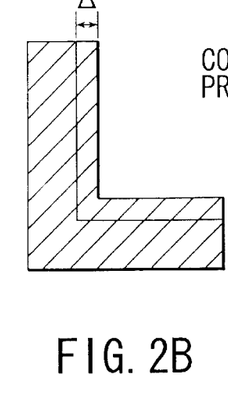

Before performing simulation, mask data representing the shape of a mask pattern (which is defined as opaque are on the mask) to be formed is generated in the following way (Step S1). First, as shown in FIG. 2B, a positive bias Δ is added to the design data shown in FIG. 2A, in consideration of a size change that will take place during the processing of the mask (Step S1-1). The bias Δ corresponds to the difference between the size of a finished mask-drawn resist and the design size thereof.

Figure 2C:
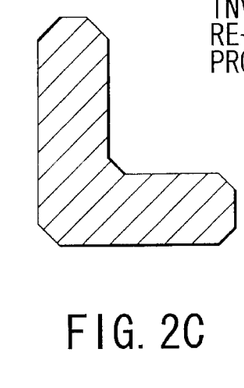
Figure 3A:
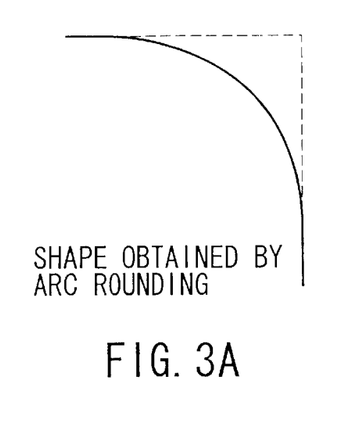
FIG. 3A is a schematic representation of mask data acquired by arc rounding process.
Figure 3B:
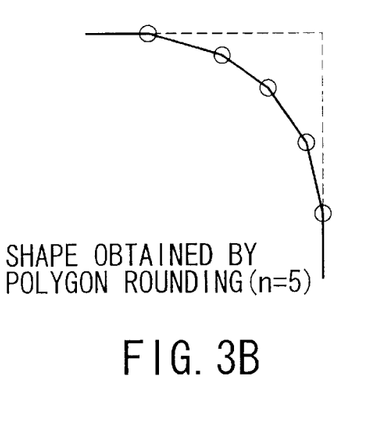
FIG. 3B is a schematic representation of mask data obtained by polygon rounding (n=5) process.
Figure 3C:
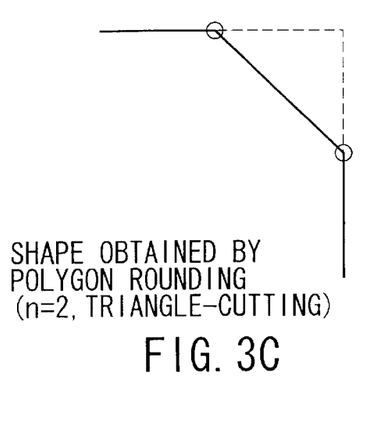
FIG. 3C is a schematic representation of mask data generated by polygon rounding (n=2, triangle-cutting) process.

Next, as shown in FIG. 2C, the corners of the pattern are uniformly rounded in accordance with the resolution of the resolution of the mask-drawing apparatus (Step S1-2). FIGS. 3A to 3C show how the corners of the pattern are rounded. Assume that the shape of the mask-drawn resist corresponds to the distribution of light applied in the mask-drawing process, whether the process is achieved by applying an electron beam or light. Then, the corners of the resist pattern are rounded, each with the same radius of curvature, no matter whether it is an outside corner or an inside corner. In practice, each corner may be subjected to corner-cutting process (FIG. 3B or FIG. 3C), instead of being rounded (FIG. 3A).

Figure 2D:
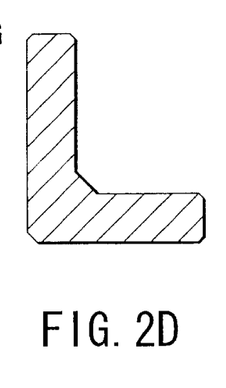

Then, as shown in FIG. 2D, a negative bias Δ', which is inverse to the value applied in the re-sizing process of FIG. 2B, is added to the data representing the pattern that has rounded corners as shown in FIG. 2C. It is desirable that the positive bias Δ and the negative bias Δ' have the same absolute value. However, they may differ in absolute value in practice, and the negative bias Δ' can be changed if necessary.

Figures 4A, 4B:
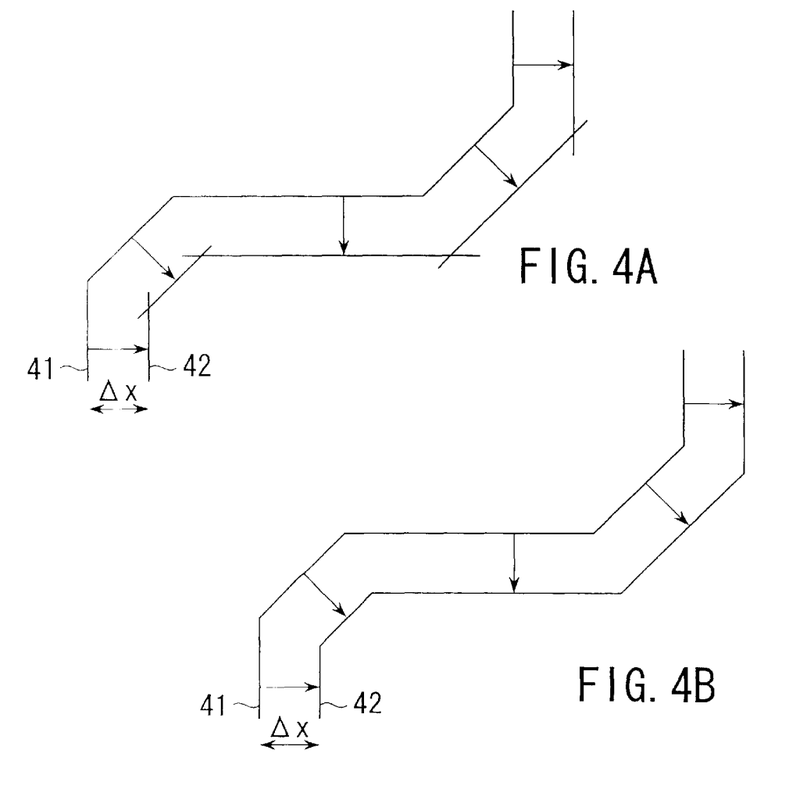
FIGS. 4A and 4B are diagrams for explaining how a mask pattern changes in shape during a re-sizing process.

How the mask pattern changes in shape during the re-sizing process, with reference to FIGS. 4A and 4B and FIG. 9. In FIG. 4A, numeral 41 indicates the shape of a mask-drawn resist formed by the conventional method (FIG. 9), which is a model shown in a CAD screen. In the re-sizing process hitherto described, the sides of the original resist are first moved in vertical direction by a re-sizing distance and are then connected together. The resist, thus re-sized, with the sides connected together, has such as shape as is indicated at numeral 42 in FIG. 4B.

In the re-sizing process, any outside corner of the resist pattern is rounded to a small degree, whereas any inside corner is round to a great degree. Thus, a mask formed by etching (see 72 in FIG. 9) can be simulated. Mask data is thereby generated.

Various exposure conditions, such as NA, λ and σ, are set (Step S2). Then, calculations are carried out, obtaining an optical image (Step S3).

The mask data generated by processing the original mask data in the present invention and the simulation effected by using the mask data thus generated will be described below.

Figure 5A:
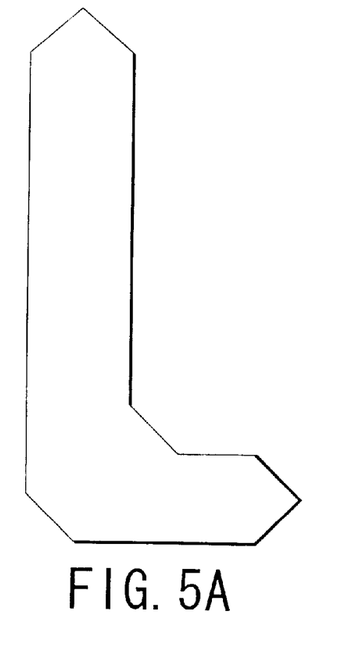
FIG. 5A is a diagrammatic representation of mask data generated by performing uniform corner process on uniform mask data.
Figure 5B:
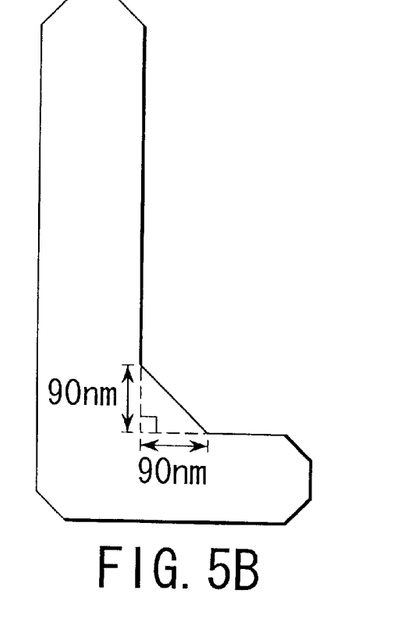
FIG. 5B is diagrammatic representation of mask data generated by carrying out a re-sizing process, a corner process and the re-sizing process again.

FIG. 5A is a schematic representation of the mask data generated by performing uniform corner process on uniform mask data. FIG. 5B is diagrammatic representation of mask data generated by carrying out the re-sizing process, corner process and re-sizing process again, all described above. The mask data of FIG. 5A has been generated by processing the original mask data, changing each corner to an isosceles triangle having 90 nm sides. The mask data of FIG. 5B has been generated by subjecting the original mask data to re-sizing process of +45 nm, by changing each corner to an isosceles triangle having 90 nm sides, and by subjecting the original mask data to re-sizing process of −45 nm.

The mask data shown in FIG. 5A and the mask data shown in FIG. 5B were used to obtain an optical image. Exposure conditions, i.e., the numerical aperture (NA) and the coherence factor (σ) of the projection optical system, the wavelength (λ) of the light applied in the exposure apparatus, a COG (chromium-on-glass) fourfold mask coherence factor (σ), a 0.18 μm design (on wafer), and just focus. More specifically, NA=0.6, λ=248 nm, and σ=0.75.

Figure 6:
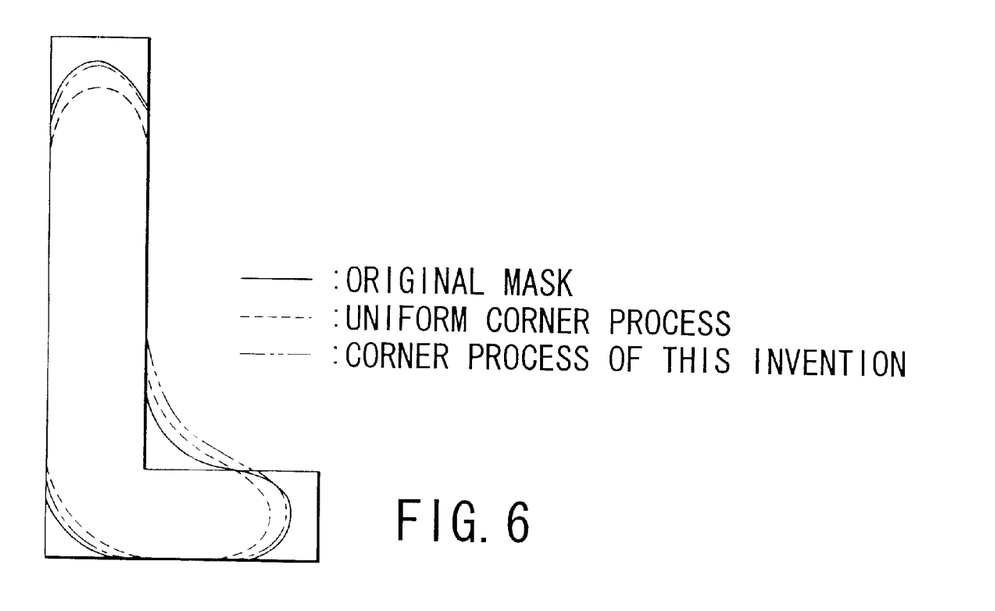
FIG. 6 is a diagram illustrating the results of simulation effected by using the mask data shown in FIGS. 5A and 5B.

FIG. 6 shows the optical image obtained by performing the calculations by using the mask data shown in FIG. 5A and the mask data shown in FIG. 5B. As is evident from FIG. 6, the results of transfer simulation greatly changed in accordance with the corner process performed. In order to increase the precision of simulation, it is necessary to obtain an optical image after a mask shape has been simulated in almost the same way as a mask is formed in practice.

How the corner process according to the present invention influences the results of transfer simulation will be explained, with reference to FIGS. 3A to 3C, FIG. 7 and FIG. 8.

Figure 7:
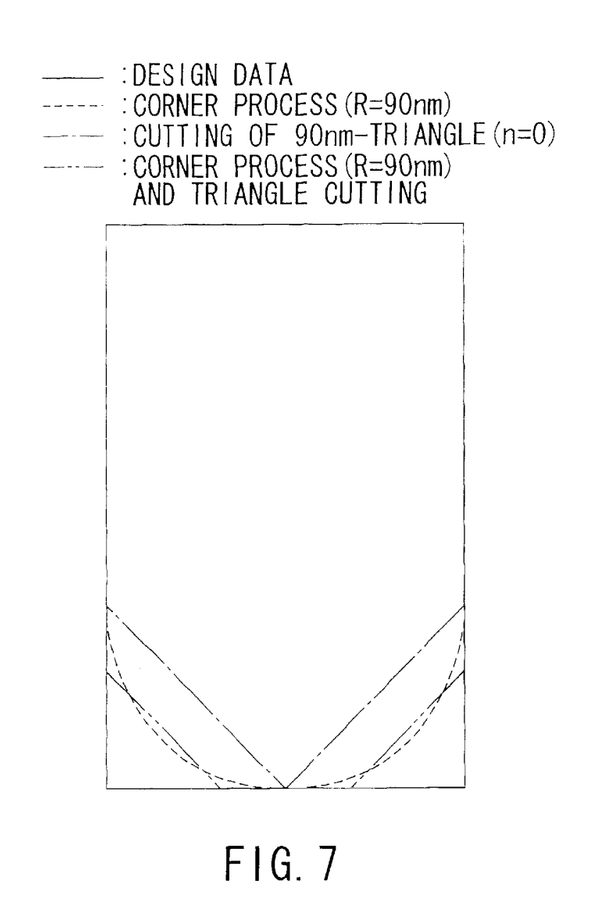
FIG. 7 is a schematic representation of mask data generated by performing various types of corner processing.
Figure 8:
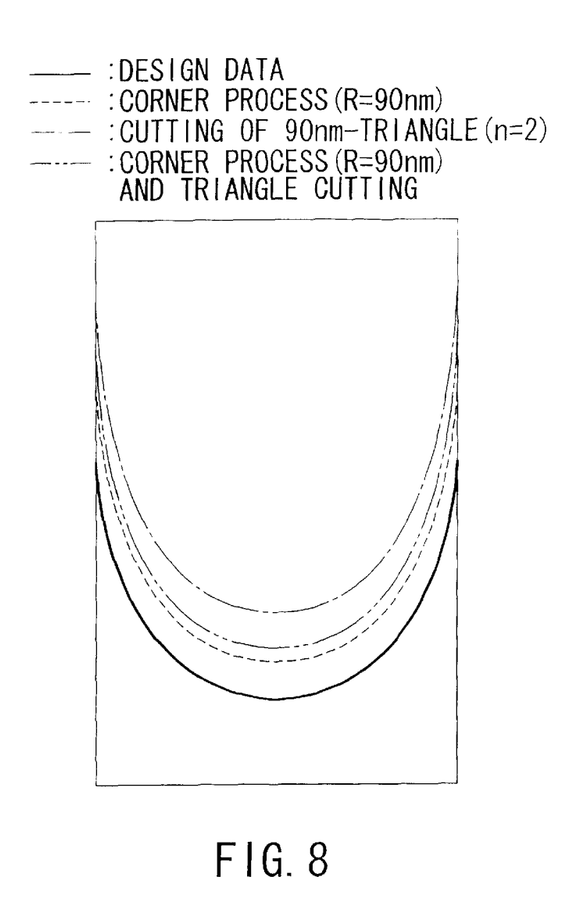
FIG. 8 is a diagram illustrating the results of simulation effected by using the mask data shown in FIG. 7.

As can be understood from in FIGS. 3A to 3C, the corners of the pattern can be processed in various ways. Each corner may be rounded in the form of an arc, as is illustrated in FIG. 3A. Alternatively, each corner may be rounded in the form of a polygon as shown FIG. 3B. Still alternatively, it may be rounded by cutting a triangle, as is illustrated in FIG. 3C. As shown in FIG. 7, these various corner processes were performed. The exposure conditions applied were identical to those used to obtain the optical image shown in FIG. 6. FIG. 8 shows the results of this transfer simulation (i.e., the optical image formed by the transfer simulation). The transfer pattern shown has a threshold value so that the optical image may have intensity of 0.3. As seen from FIG. 8, the areas processed in the various corner processes, respectively, are almost equal. Thus, the results of the transfer simulation can be of high precision, almost identical to the most practical shape (i.e., circular shape).

The process according to the present invention could be realized by the use of a simple combination of CAD commands. The mask pattern obtained by the process was used, successfully increasing the precision of simulating the image-intensity distribution on the wafer.

The values to be applied to the corner process (e.g., re-sizing value and corner-rounding value) should be changed in accordance with each mask-drawing process. The total re-sizing value may be non-zero in accordance with the difference between the design size and the size of the mask formed. The corners of the mask pattern according to the present embodiment are all right-angled ones. Nonetheless, the apex angles of the pattern corners are not limited to a specific value in the present invention.

The simulation of the data of an exposure mask pattern, described above, can be accomplished by reading a program from a recording medium and writing the same into a computer.

The recording medium according to this invention can be of any storage type so long as it can store programs and the data it holds can be read by computers. The medium is a magnetic disk, a floppy disk, a hard disk, an optical disk (CD-ROM, CD-R, DVD, or the like).

Some of the processes realizing the present invention may be performed by using the OS (Operating System) working in a computer in accordance with the program installed into the computer from the recording medium or by utilizing the MW (Middleware) such as database management software and network software.

Moreover, the recording medium of the invention is not limited to one that is used outside a computer. Rather, it may be one incorporated in a computer, into which programs may be loaded via LAN or Internet and stored permanently or temporarily.

The process or processes are performed in the present embodiment by using only one recording medium or two or more recording media. In the case where two or more media are used, they may be of either the same type or different types.

The computer for use in the present invention is one that performs various processes in accordance with the programs recorded in a recording medium. It may be a personal computer or system comprising Internet-connected computers.

The computer is not limited to a personal computer. Rather, it may be a computing device or a microcomputer, which is incorporated in a data-processing apparatus. It may be any device that performs the processes of this invention in accordance with programs.

The present invention is not limited to the embodiment described above. Various changes and modifications can be made, without departing from the scope of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of processing exposure mask-pattern date comprising the steps of:

performing a re-sizing process of adding a prescribed positive bias Δ to design data of an exposure mask pattern, thereby forming first mask-pattern data;

performing a corner process on each corner represented by the first mask-pattern data, thereby forming second mask-pattern data; and performing a re-sizing process of adding a prescribed negative bias Δ' to the second mask-pattern data, thereby forming third mask-pattern data.

2. A method according to claim 1, wherein a sum of the positive bias Δ and negative bias Δ' is a mask bias for the design data of the exposure mask pattern, and the positive bias Δ corresponds to a bias for a mask-drawing resist pattern.

3. A method according to claim 1, wherein the corner process is to round each corner represented by the first mask-pattern data, thereby forming an arc which has a radius R and which inscribes the corner.

4. A method according to claim 1, wherein the corner process is to replace, at each corner represented by the first mask-pattern data, an arc having a radius R and inscribing the corner, by a plurality of continuous lines.

5. A method according to claim 4, wherein a change in area of a pattern, which takes place after the arc has been replaced by a plurality of continuous lines, is equal to a change in area of the pattern, which occurs when the corner is changed to an arc having a radius R and inscribing the corner.

6. A method of simulating an optical image by applying light through an exposure mask pattern, comprising the steps of:

performing a re-sizing process of adding a prescribed positive bias $\Delta$ to design data of the exposure mask pattern, thereby forming first mask-pattern data;

performing a corner process on each corner represented by the first mask-pattern data, thereby forming second mask-pattern data;

performing a re-sizing process of adding a prescribed negative bias $\Delta'$ to the second mask-pattern data, thereby forming third mask-pattern data;

setting exposure conditions; and calculating a optical image in accordance with the third mask pattern data and the exposure conditions, on a substrate to which light is applied through the exposure mask pattern.

7. A method according to claim 6, wherein a sum of the positive bias $\Delta$ and negative bias $\Delta'$ is a mask bias for the design data of the exposure mask pattern, and the positive bias $\Delta$ corresponds to a bias for a mask-drawing resist pattern.

8. A method according to claim 6, wherein the corner process is to round each corner represented by the first mask-pattern data, thereby forming an arc which has a radius R and which inscribes the corner.

9. A method according to claim 6, wherein the corner process is to replace, at each corner represented by the first mask-pattern data, an arc having a radius R and inscribing the corner, by a plurality of continuous lines.

10. A method according to claim 9, wherein a change in area of a pattern, which takes place after the arc has been replaced by a plurality of continuous lines, is equal to a change in area of the pattern, which occurs when the corner is changed to an arc having a radius R and inscribing the corner.

11. A recording medium from which data can be read by a computer and which stores a program for performing a predetermined process on design data of an exposure mask pattern, wherein said program has the functions of:

performing a re-sizing process of adding a prescribed positive bias $\Delta$ to design data of an exposure mask pattern, thereby forming first mask-pattern data;

performing a corner process on each corner represented by the first mask-pattern data, thereby forming second mask-pattern data; and performing a re-sizing process of adding a prescribed negative bias $\Delta'$ to the second mask-pattern data, thereby forming third mask-pattern data.

12. A recording medium according to claim 11, wherein a sum of the positive bias $\Delta$ and negative bias $\Delta'$ is a mask bias for the design data of the exposure mask pattern, and the positive bias $\Delta$ corresponds to a bias for a mask-drawing resist pattern.

13. A recording medium according to claim 11, wherein the corner process is to round each corner represented by the first mask-pattern data, thereby forming an arc which has a radius R and which inscribes the corner.

14. A recording medium according to claim 11, wherein the corner process is to replace, at each corner represented by the first mask-pattern data, an arc having a radius R and inscribing the corner, by a plurality of continuous lines.

15. A recording medium according to claim 14, wherein a change in area of a pattern, which takes place after the arc has been replaced by a plurality of continuous lines, is equal to a change in area of the pattern, which occurs when the corner is changed to an arc having a radius R and inscribing the corner.

* * * * *

UNITED STATES PATENT AND TRADEMARK OFFICE
CERTIFICATE OF CORRECTION

PATENT NO.    : 6,536,032 B1
DATED         : March 18, 2003
INVENTOR(S)   : Tanaka et al.

It is certified that error appears in the above-identified patent and that said Letters Patent is hereby corrected as shown below:

Column 6,
Line 52, change "date" to -- data --.

Column 7,
Line 29, change "a optical" to -- an optical --.

Signed and Sealed this

Tenth Day of June, 2003

JAMES E. ROGAN
*Director of the United States Patent and Trademark Office*